(12) United States Patent
Wang et al.

(10) Patent No.: US 7,265,405 B2
(45) Date of Patent: Sep. 4, 2007

(54) METHOD FOR FABRICATING CONTACTS FOR INTEGRATED CIRCUITS, AND SEMICONDUCTOR COMPONENT HAVING SUCH CONTACTS

(75) Inventors: Kae-Horng Wang, Dresden (DE); Ralf Staub, Dresden (DE); Matthias Krönke, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/754,439

(22) Filed: Jan. 9, 2004

(65) Prior Publication Data
US 2004/0195596 A1 Oct. 7, 2004

Related U.S. Application Data

(63) Continuation of application No. PCT/EP02/07507, filed on Jul. 5, 2002.

(30) Foreign Application Priority Data
Jul. 12, 2001 (DE) ............................... 101 33 873

(51) Int. Cl.
*H01L 29/94* (2006.01)
(52) U.S. Cl. .................. 257/307; 257/306; 257/308; 257/E21.507; 257/E21.59; 438/629; 438/637
(58) Field of Classification Search ............... 257/222, 257/295, 308, 309, 306, 307; 438/256, 396, 438/629
See application file for complete search history.

(56) References Cited
U.S. PATENT DOCUMENTS
4,662,064 A 5/1987 Hsu et al. .................... 29/591

(Continued)

FOREIGN PATENT DOCUMENTS
DE 199 35 852 A1 2/2001

(Continued)

OTHER PUBLICATIONS

Kohyama, Y.; Ozaki, T.; Yoshida, S.; Ishibashi, Y.; Nitta, H.; Inoue, S.; Nakamura, K.; Aoyama, T.; Imai, K.; Hayasaka, N., A Fully Printable, Self-aligned And Planarized Stacked Capacitor DRAM Cell Technology For 1Gbit DRAM And Beyond, 1997 Symposium on VLSI Technology, Digest of Technical Papers, pp. 17-18, Publication Date: Jun. 10-12, 1997.

(Continued)

*Primary Examiner*—Andy Huynh
*Assistant Examiner*—Dao H. Nguyen
(74) *Attorney, Agent, or Firm*—Patterson & Sheridan, L.L.P.

(57) ABSTRACT

One (or more) contacts are produced on one or more active areas of a semiconductor wafer, it being possible for one or more isolated control lines to be arranged on the active areas with which contact is to be made. The control lines may, for example, be gate lines. The semiconductor component is fabricated in the following way: application of a polysilicon layer to the semiconductor wafer, patterning of the polysilicon layer, in order to produce a polysilicon contact above the active area, the polysilicon contact at least partly covering the two control lines, application of a first insulator layer to the semiconductor wafer, with the polysilicon contact being embedded, partial removal of the first insulator layer, so that at least the upper surface of the polysilicon contact is uncovered, and application of a metal layer to the semiconductor wafer in order to make electrical contact with the polysilicon contact.

18 Claims, 6 Drawing Sheets

U.S. PATENT DOCUMENTS

| | | | |
|---|---|---|---|
| 5,362,666 A * | 11/1994 | Dennison | 438/396 |
| 5,541,870 A * | 7/1996 | Mihara et al. | 365/145 |
| 5,910,020 A | 6/1999 | Yamada | |
| 5,981,326 A | 11/1999 | Wanlass | 438/227 |
| 6,027,997 A | 2/2000 | Yu et al. | |
| 6,083,803 A | 7/2000 | Fischer et al. | 438/396 |
| 6,096,633 A | 8/2000 | Hsu | |
| 6,159,808 A | 12/2000 | Chuang | 438/291 |
| 6,159,843 A | 12/2000 | Lin | |
| 6,174,782 B1 * | 1/2001 | Lee | 438/396 |
| 6,180,453 B1 | 1/2001 | Sung et al. | 438/256 |
| 6,239,022 B1 * | 5/2001 | Seo et al. | 438/629 |
| 2002/0047153 A1 * | 4/2002 | Nakamura et al. | 257/306 |

FOREIGN PATENT DOCUMENTS

| | | |
|---|---|---|
| DE | 101 19 873.6 | 4/2001 |
| EP | 0 365 493 | 4/1990 |
| JP | 10-214949 | 8/1998 |
| JP | 2001-035 808 | 2/2001 |
| WO | WO99/44232 | 9/1999 |

OTHER PUBLICATIONS

German Patent Office Examination Report dated Jan. 15, 2002. (Translation included).

PCT International Search Report dated Mar. 5, 2003.

German Patent Office Examination Report dated Jul. 19, 2004. (Translation included).

* cited by examiner

METHOD FOR FABRICATING CONTACTS FOR INTEGRATED CIRCUITS, AND SEMICONDUCTOR COMPONENT HAVING SUCH CONTACTS

CROSS-REFERENCE TO RELATED APPLICATIONS

This application is a continuation of co-pending PCT Patent Application No. PCT/EP02/07507, filed Jul. 5, 2002, which claims the benefit of German patent application serial number 101 33 873.2-33, filed Jul. 12, 2001. Each of the aforementioned related patent applications is herein incorporated by reference in their entireties.

BACKGROUND OF THE INVENTION

1. Field of the Invention

The invention relates to a method for fabricating contacts, in particular bit line contacts, for an integrated circuit (IC) on a semiconductor wafer, and to a semiconductor component having a contact of this type, in particular for use in a dynamic random access memory (DRAM).

2. Description of the Related Art

Making electrical contact with active areas (AAs), which in the context of the present application is to be understood as meaning those regions of a semiconductor surface in which electrically active structures, such as for example transistors, capacitors or any semiconductor structures which belong to a memory cell of a DRAM, are embedded, represents one of the central problems in the manufacture of modern ICs and in particular DRAMs. Low electrical resistances and small capacitances are indispensable in order to achieve rapid electrical switching operations.

According to the prior art, to make contact with an active area of an integrated circuit on a semiconductor chip, for example with a (metallic) bit line above it, contact structures are formed in an insulator layer of the semiconductor chip and are then filled with a conducting material. The band structure of this conducting material is preferably matched to the band structure of the active area below it, with which contact is to be made. In the case of ICs which are based on silicon, the conducting material used is generally doped polysilicon.

In the processes which have hitherto been customary for making contact with active areas, the contacts are fabricated by means of a multistage method. A homogeneous insulator layer, for example of $SiO_2$ which is deposited using the TEOS process, is applied to the surface of the semiconductor wafer to which control lines, which are generally already enclosed in an insulator layer (e.g. consisting of silicon nitride), such as for example gate lines (gate contacts, GC, e.g. comprising doped polysilicon), have generally already been applied. In a subsequent method step, which comprises a photolithographic patterning operation and a subsequent locally active etching step, this homogeneous insulator layer is provided with what is known as a contact hole in the region of the active area with which contact is to be made. This contact hole is then filled with a conducting material and finally is covered with an extensive (metallic) bit line, resulting in electrically conductive contact between active area and bit line (bit line contact CB).

The contact hole which has been produced in the insulator layer extends as far as the surface of the active area, which generally, for process reasons, has been covered with an insulating native $SiO_2$ layer which is a few nanometers thick. In order, despite this insulator layer, to produce an electrically conductive connection between the active area and a conducting material which is to be introduced into the contact hole during a subsequent process step, various methods are known for eliminating the native oxide layer, the application of which is dependent on the particular conducting material used.

If polysilicon is used as conducting material (polysilicon process), which offers particular advantages on account of the fact that its band structure is close to that of the active area, the native oxide layer has to be removed in a preceding, generally wet-chemical cleaning step. Chemical substances, such as BHF, are used for this purpose and, which in addition to attacking the native oxide layer, often also attack the insulator layer which has been applied to the entire surface or the insulating cladding of the gate lines. This may lead to locally undefined removal of material from the insulator layers, in particular at the edges thereof.

Widening of the contact hole which cannot be accurately controlled and is inevitably associated with the above cleaning step causes particular difficulties in terms of process technology. If the contact hole is additionally spatially delimited by gate lines, material may likewise be removed in an undefined manner from the insulator layers which surround these gate lines. Extensive removal of the material from the surrounding insulator layers may in extreme circumstances even lead to the embedded gate line being uncovered. If the contact hole is filled with polysilicon in the subsequent method step, an electrically conductive connection may be formed between polysilicon/bit line, on the one hand, and gate line, on the other hand, i.e. the associated electronic component is short-circuited.

However, removing too little material during the wet-chemical cleaning step leads to incomplete removal of the native oxide layer. Therefore, during the subsequent filling of the contact hole with polysilicon, there is no electrically conductive contact produced between the active area and the polysilicon. Ultimately, there is no electrical contact produced between the bit line and the active area, and contact is therefore not made with the associated electronic component.

To limit this difficulty in terms of process technology, hitherto the diameter of the contact hole has been selected to be small, in order to maintain a considerable distance from any gate lines which may be present and thereby to minimize the risk of short circuits between gate lines and bit lines. However, such a small diameter of the contact hole leads to further difficulties in terms of process engineering. For example, as the structures become ever smaller, it becomes more difficult to produce sharply delineated structures, on account of the nonlinear nature of the photolithographic process, and on the other hand in the case of small structures the aspect ratio during the subsequent etching step is greatly limited.

Therefore, during the further development of the known polysilicon process, primarily the chemical selectivity of the etching process has been optimized, in order to avoid undesirable removal of material from the insulator layers surrounding the gate lines. However, this requires the use of different materials for the insulation which surrounds the gate lines and the large-area insulator layers.

The German application which bears the reference number 101 19 873.6, which is in the name of the present applicant and has not yet been published, has disclosed an alternative method for fabricating contacts on semiconductor surfaces, which is based on the use of metals as conducting materials for filling the contact holes. In one configuration of the method, the metallic conducting material is introduced into the contact holes by means of the (dual) damascene process.

In an advantageous refinement of this known method, there is no need for wet-chemical removal of the native oxide on the surface of the active areas, since the native oxide is removed using the "self-aligned contacts" (SAC) method by means of reducing silicon formation between metallic conducting material and native oxide. However, the "self-aligned contacts" method is restricted to a small number of metals. Only the metals Mo, W, Ti and Ta are particularly suitable, and hitherto the use of Ti has dominated. If other metals, such as for example Cu, are used as conducting material, in general an etching step is required once again for removal of the native oxide layer, which has all the drawbacks which have been mentioned above.

Moreover, when a metallic conductor material is used, targeted doping of the surface of the active area is necessary in order to produce a metal-semiconductor ohmic contact. This doping with subsequent annealing step requires additional method steps, which entail additional costs.

SUMMARY OF THE INVENTION

Therefore, it is an object of the present invention to provide an improved method for fabricating a contact, in particular a bit line contact, for an integrated circuit (IC) on a semiconductor wafer, and a semiconductor component having a contact of this type.

The method according to the invention produces one (or more) contacts on one or more active areas of the semiconductor wafer, with one or more isolated control lines, between which the contacts are formed, being arranged on the active areas with which contact is to be made. The control lines may, for example, be gate lines.

The method includes the following method steps:
a) application of a poly silicon layer (3) to the semiconductor wafer (1),
b) patterning of the polysilicon layer (3), in order to produce a polysilicon contact (4) above the active area (2), the polysilicon contact (4) at least partly covering the two control lines (7),
c) application of a first insulator layer (5) to the semiconductor wafer (1), with the polysilicon contact (4) being embedded,
d) partial removal of the first insulator layer (5), so that the outer surface of the polysilicon contact (4) is uncovered, and
e) application of a metal layer (6) to the semiconductor wafer (1) in order to make electrical contact with the polysilicon contact (4).

Of course, the parallel production of a plurality of contacts on one active area or on a plurality of active areas is possible. However, for the sake of simplicity, the following text will always refer to the production of one contact on one active area. Furthermore, wording such as "application of a layer to the semiconductor wafer" is always to be understood as meaning a large-area application of a substantially homogeneous layer to the entire surface of the semiconductor wafer, and it is possible for the semiconductor wafer already to have been covered with a multiplicity of (patterned) layers on its surface.

In the context of the method, in the first method steps a conductive polysilicon contact, which is spatially isolated on the active surface with which contact is to be made and may in particular cover part of the insulator layers surrounding the control lines, is produced. Particularly when using the self-aligned contacts method, short circuits between one or more control lines and the contact which is to be produced, which may in particular be a bit line contact, often occur in this contact region.

During the structured removal of the polysilicon layer for production of the polysilicon contact by means of a suitable etching process, by contrast, the above contact region is protected by the polysilicon contact itself. Removal (possibly undefined) of the insulator layers which enclose the control lines primarily in the edge region takes place only in those regions in which no contacts are to be applied. These regions are generally filled up with insulating material in subsequent process steps. Therefore, in the contact region in which there is a risk of short-circuiting, there can be no removal of the insulator layers which enclose the control lines. In this way, a short circuit between one or more control lines and the polysilicon contact can be reliably avoided.

This self-covering of the contact regions which are at risk of short-circuiting by the polysilicon contact has the further consequence that even relatively large diameters of the polysilicon contact can be achieved without increasing the risk of short circuits between the control lines and the polysilicon contact. By contrast, increasing the size of the contact in the self-aligned contact method increases the risk of short circuits, since in parallel with the increase in size of the contacts, the contact area which has to be etched clear of the insulator layers enclosing the control lines, which are removed in undefined fashion during the patterning of the contact hole, increases.

Therefore, the method according to the invention offers the further advantage of allowing larger contact dimensions, in particular diameters. Larger contact dimensions on the one hand offer considerable advantages in terms of lithography and on the other hand reduce the electrical resistance of the contact which is produced, which improves the switching speeds which can be achieved in the driven semiconductor component.

The method according to the invention is based on the fact that the contact which is to be formed on the active area is not produced by filling a contact hole in an insulator layer which has been applied first, but rather the contact is produced first, by patterning an expansive layer of a suitable conducting material, and then this contact is embedded in an insulator layer in a subsequent method step.

Particular advantages of the method according to the invention result if the polysilicon layer which is applied in step a) is doped with foreign atoms in such a manner that the electrical properties of the polysilicon layer are matched to the electrical properties of the active area with which contact is to be made. The electrical properties of the active area with which contact is to be made may differ locally on account of the doping with foreign atoms differing in three dimensions, for example.

To pattern the polysilicon layer in accordance with method step b), it is advantageous for a first mask, for example in the form of a resist layer or a surface oxide layer, to be applied to the semiconductor wafer, i.e. to the surface of the polysilicon layer. This first mask is patterned by means of a lithographic process, which may be a known process. The lithographic process which is to be selected is determined substantially by the mask material which is used. In a subsequent removal step, the polysilicon layer is removed in patterned fashion so as to form the polysilicon contact above the active area. For this purpose, it is recommended to use a highly anisotropic etching process, such as for example reactive ion etching (RIE), which allows high aspect ratios.

Further advantages result if the first insulator layer, which is applied in method step c), consists of phosphosilicate glass (PSG) or of silicate glass which is doped with boron and phosphorus (BPSG). PSG and BPSG offer particular advantages with regard to the planarization of the contact structure produced, since it can be selectively removed and leveled by means of thermal flow and subsequent etching back. Furthermore, it can also be effectively removed over a large area by means of chemical mechanical polishing (CMP).

To prevent the dopants which may be present in the first insulator layer from diffusing out into the semiconductor structure, after the patterning of the polysilicon layer which has taken place in method step c) in order to produce the polysilicon contact, it is advantageously possible for a first liner layer to be applied to the semiconductor wafer as a diffusion barrier. A diffusion barrier of this type reliably encloses the active area with which contact is to be made, including the control lines located thereon and the polysilicon contact, and prevents contamination with the dopants which may be present in the first insulator layer during subsequent conditioning steps.

The method steps which follow method steps a) to c), namely d) partial removal of the first insulator layer, with the outer surface of the polysilicon contact being uncovered, and e) application of a metal layer to the semiconductor wafer in order to make electrical contact with the polysilicon contact, make it possible to form a metallic supply conductor, which may form part of an i-th metallization level M-i. The uncovering of the polysilicon contact may in this case be carried out by means of chemical mechanical polishing, for example.

However, it should be noted that in most cases the uncovered outer surface of the polysilicon contact is covered with an insulating native $SiO_2$ layer. This $SiO_2$ layer prevents direct contact from being made between the polysilicon contact and a metallic layer. It can be converted into a highly conductive layer, which is matched to the electrical properties of the semiconducting polysilicon contact, on the one hand, and of the metallic layer, on the other hand, by silicide formation. A silicide layer of this type allows the formation of an ohmic contact between the polysilicon contact and the metallic layer. Therefore, in the context of the method according to the invention, the self-aligned contact method is only used to form an electrically conductive connection between the upper outer surface of the polysilicon contact and the metal layer.

To convert any native $SiO_2$ layer which may be present on the outer surface of the polysilicon layer, it is advantageous for a second liner layer, which is intended to form silicide with the polysilicon contact, to be applied to the semiconductor wafer after the partial removal of the first insulator layer which has taken place in method step d). This second liner layer may, for example, consist of the metals titanium, cobalt or nickel. The required thickness of this second liner layer is determined by the thickness of the $SiO_2$ layer which is to be converted.

To carry out any patterning of the metallic layer which may be required, it is advantageous if a second insulator layer, which may, for example, consist of $SiO_2$ deposited using the TEOS process or of PSG, is applied before the application of the metallic layer to the semiconductor wafer. This second insulator layer is then patterned using lithographic processes, which may be known processes, in order to determine the path of the interconnects in the metallic layer which is to be produced. Only after patterning of the second insulator layer is the metal layer applied in a further method step. Finally, the surface of the semiconductor wafer which bears the structures which have been produced can be leveled and/or removed by means of a further planarization step. The second liner layer, which is to be applied as described above in order to form a highly conductive silicide layer on the outer surface of the polysilicon contact, is in this case advantageously applied after the patterning of the second insulator layer but before application of the metal layer to the semiconductor wafer.

The invention also relates to a semiconductor component which is based on a semiconductor wafer in/on which at least one active area is arranged. In this case, the semiconductor component has at least one electrical contact with the active area, which has been produced using the method described in claim 1. The semiconductor component may in particular be an individual semiconducting switching element, an entire memory cell or a semiconductor memory. Particular advantages result if the semiconductor component is a dynamic random access memory (DRAM).

BRIEF DESCRIPTION OF THE DRAWINGS

Further advantages and features of the invention will emerge from the subclaims and the following exemplary embodiments, which are explained with reference to the figure, in which:

DETAILED DESCRIPTION OF THE PREFERRED EMBODIMENT

Figure 1:
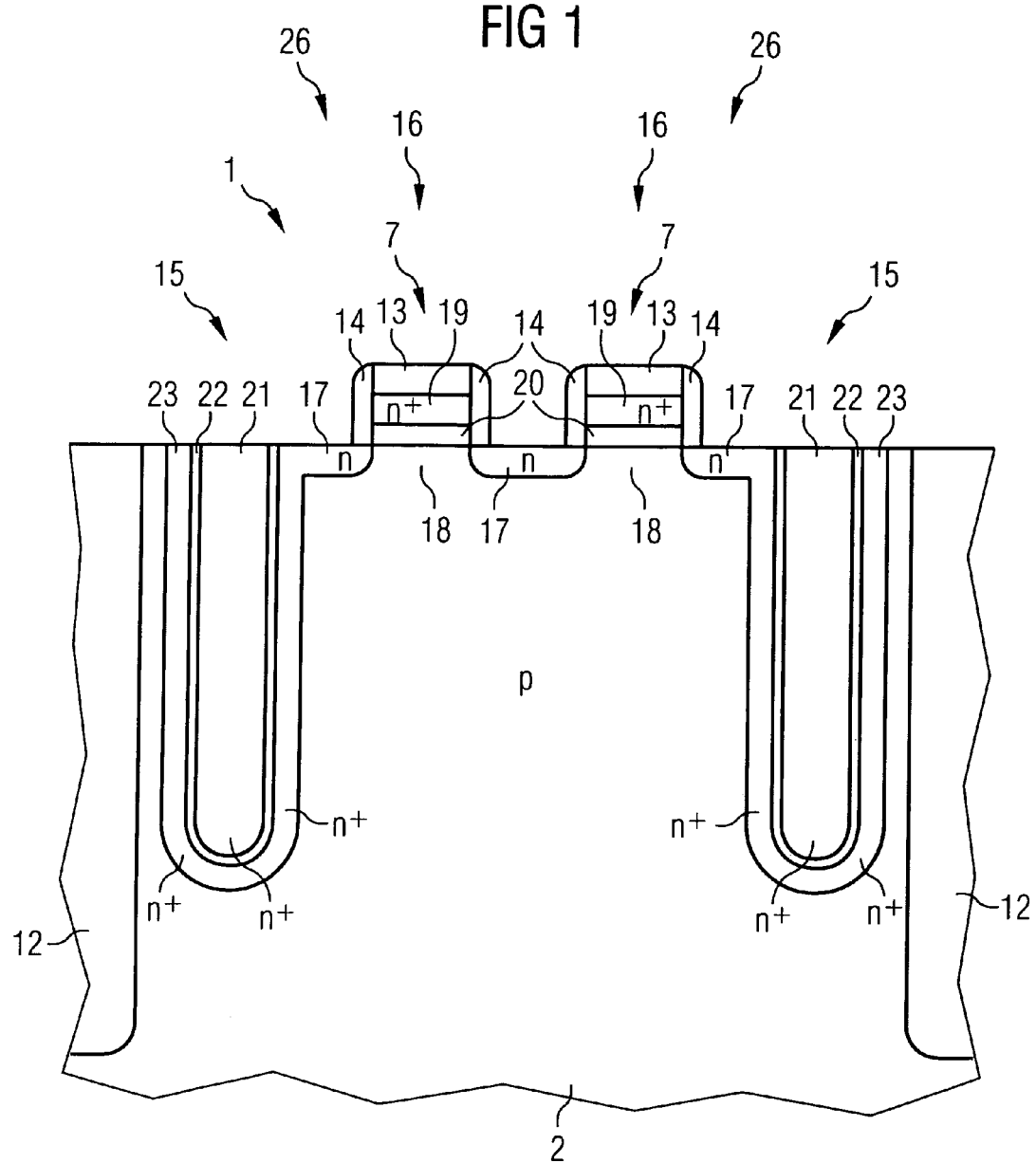
FIG. 1 shows a section through two dynamic memory cells of a DRAM, which are arranged in an active area of a semiconductor chip and are driven via a common bit line.

FIG. 1 shows a section through a semiconductor chip 1 which at its surface has an active area 2 and a passive area 12. Two dynamic memory cells 26, which comprise trench capacitors 15, are integrated in the active area 2.

The trench capacitors 15 are driven by means of two select transistors 16, which are preferably fabricated by planar technology. A select transistor 16 comprises in each case two n-doped diffusion regions 17, the active area 2 of the semiconductor wafer 1 otherwise being substantially homogeneously p-doped. The n-doped diffusion regions 17 define the source and drain electrodes of the select transistor 16.

Between the n-doped diffusion regions 17 there is a p-doped channel 18. Above this channel 18 there is a highly n-doped region 19 which extends in the form of a strip and is separated from the channel 18 by a thin insulator layer 20. The thin insulator layer 20 may, for example, consist of a few nanometers of native $SiO_2$. The outer surface of the n-doped region 19 is covered by an insulating covering layer 13. The side faces of the n-doped region 19 are covered by insulating flanks 14. Both the covering layer 13 and the flanks 14 may advantageously be formed by a few tens of nanometers of silicon nitride. The n-doped region 19 with the insulating layers 13, 14 and 20 which surround it forms a gate line 7, via which the select transistor 16 is driven.

The trench capacitor 15 is filled with a highly n-doped material which forms the inner capacitor electrode 21. This inner capacitor electrode 21 is surrounded by a thin dielectric 22, which has a high dielectric constant $\epsilon_r$, of a likewise highly n-doped region within the p-doped active area 2, which forms the outer capacitor electrode 23.

To form an electrically conductive connection with the diffusion region 17 of the select transistor 16 to the outer capacitor electrode 23, the latter has an overlap with the drain electrode, which is formed by an n-doped diffusion region 17, of the select transistor 16.

The described structure of a memory cell 26 is repeated mirror-symmetrically for the second memory cell 26. In this case, two n-doped diffusion regions 17 of the two select transistors 16 overlap in such a manner that they form a common source electrode for the two select transistors 16.

There will generally be a multiplicity of active areas 2 integrated in the semiconductor wafer 1, and these active areas will be separated from one another by passive areas 12 in order to avoid crosstalk between the various active areas 2. These passive areas 12 may be designed, for example, in the form of "shallow trench insulation" (STI).

Since the way in which contact is made with the inner capacitor electrode 21 is of no relevance to the further description of the method according to the invention, the supply conductors required for this purpose are not shown in FIG. 1.

Figure 2:
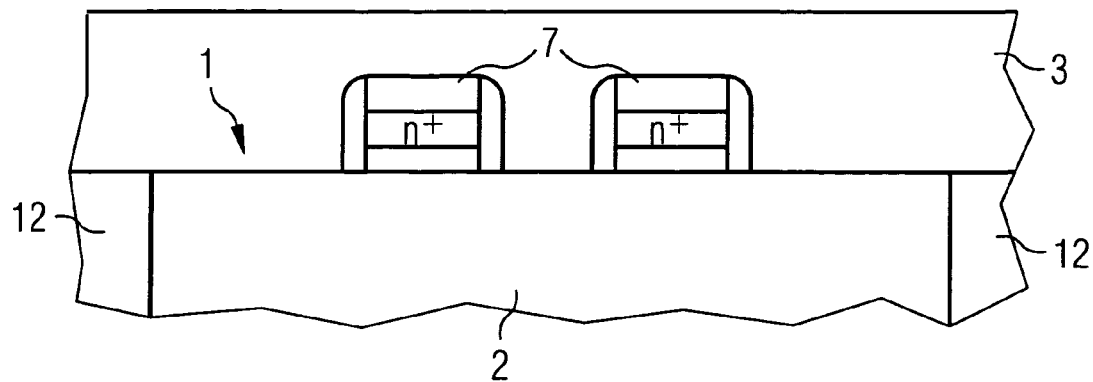
FIG. 2 shows a section through the active area shown in FIG. 1, after the application of an n-doped polysilicon layer.

To make electrical contact between that n-doped diffusion region 17 which forms the common source electrode for the select transistors 16 and a metallic bit line above it, the entire surface of the semiconductor wafer 1 is covered homogeneously with a polysilicon layer 3. The thickness of this layer is such that the gate lines 7 including the insulator layers which surround them, are completely buried beneath the polysilicon layer 3, as shown in FIG. 2.

Figure 3:
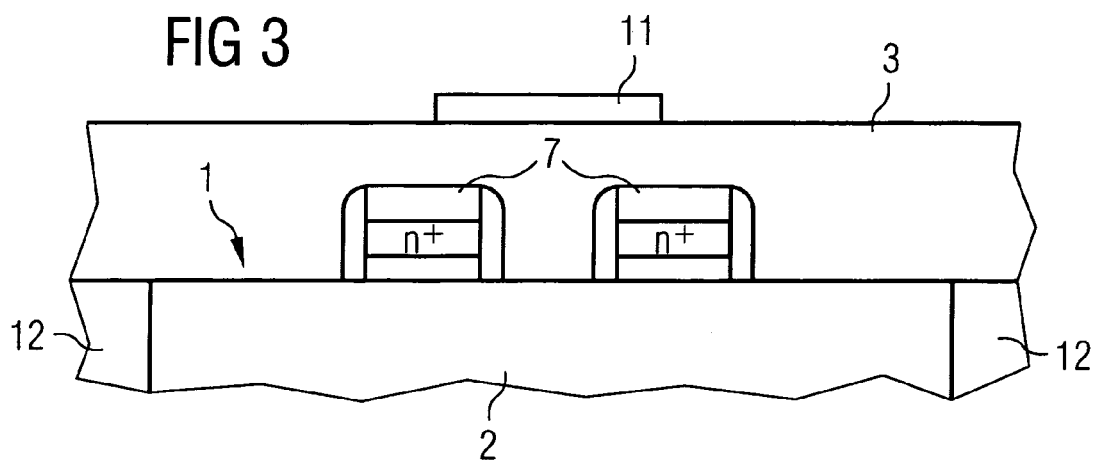
FIG. 3 shows the section from the previous figure with a patterned photoresist layer.

Then, the entire surface of the polysilicon layer 3 is homogeneously covered with a photoresist, which forms a first mask 11. The photoresist is exposed and removed in patterned form by means of conventional photolithographic techniques. The patterned first mask 11 remains on the polysilicon layer 3, as can be seen from FIG. 3.

Figure 4:
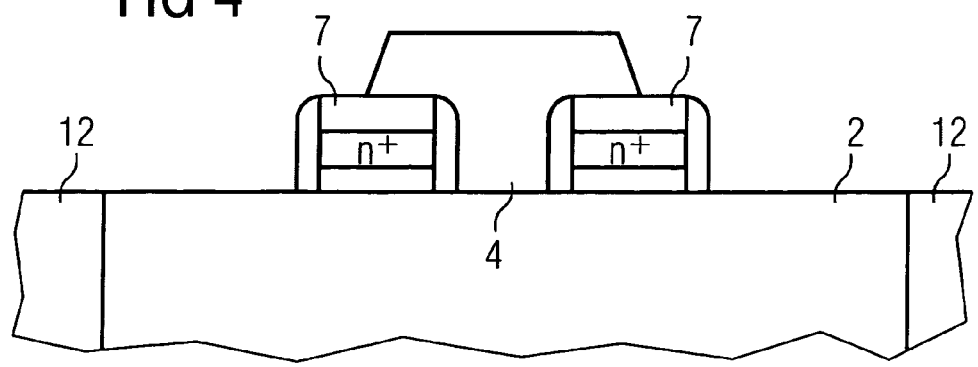
FIG. 4 shows the section from the previous figure after the patterned removal of the polysilicon layer and removal of the photoresist.

Then, an anisotropic etching process is used to remove the polysilicon layer 3 in patterned form down to the surface of the semiconductor wafer 1. Next, the first mask 11 is removed. What remains is the polysilicon contact 4, which can be seen from FIG. 4 and in its center region rests directly on the common source electrode of the select transistors 16, and which at least partly covers the two gate lines 7.

The use of an anisotropic etching process firstly has the advantage that the polysilicon contact 4 which is produced has steep flanks, and secondly reduces the amount of material removed from the uncovered flanks 14 of the gate lines 7.

Figure 5:
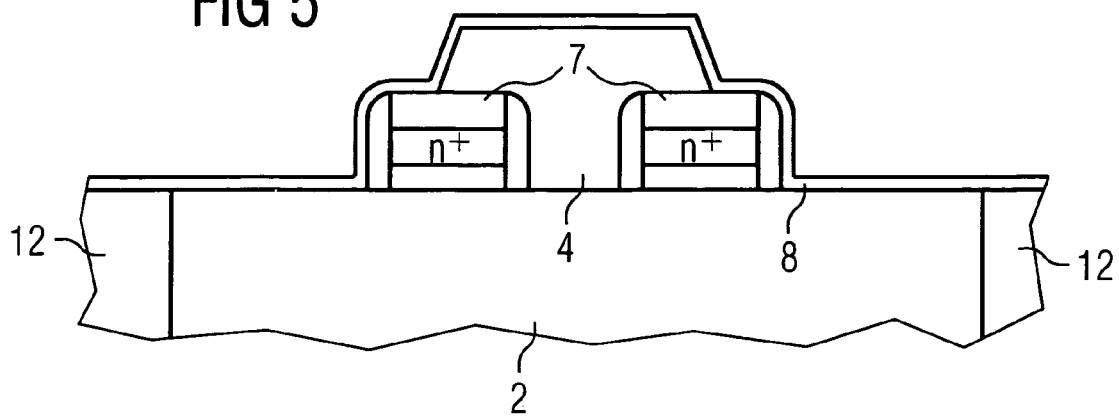
FIG. 5 shows the section from the previous figure after the liner layer has been applied.

Then, as shown in FIG. 5, the entire surface of the semiconductor wafer, including the polysilicon contact 4 located thereon and the gate lines 7, is covered with a thin first liner layer 8. This first liner layer is used as a diffusion barrier for ions from layers which are applied subsequently and may, for example, consist of a thin silicon nitride layer.

At this point, particular advantages are achieved if the first liner layer 8 consists of a silicon oxynitride layer, which has advantages with regard to the planarization of the overall structure and additionally has a getter function against ion contamination. FIG. 5 shows the structure which has been produced with the first liner layer 8 applied.

Figure 6:
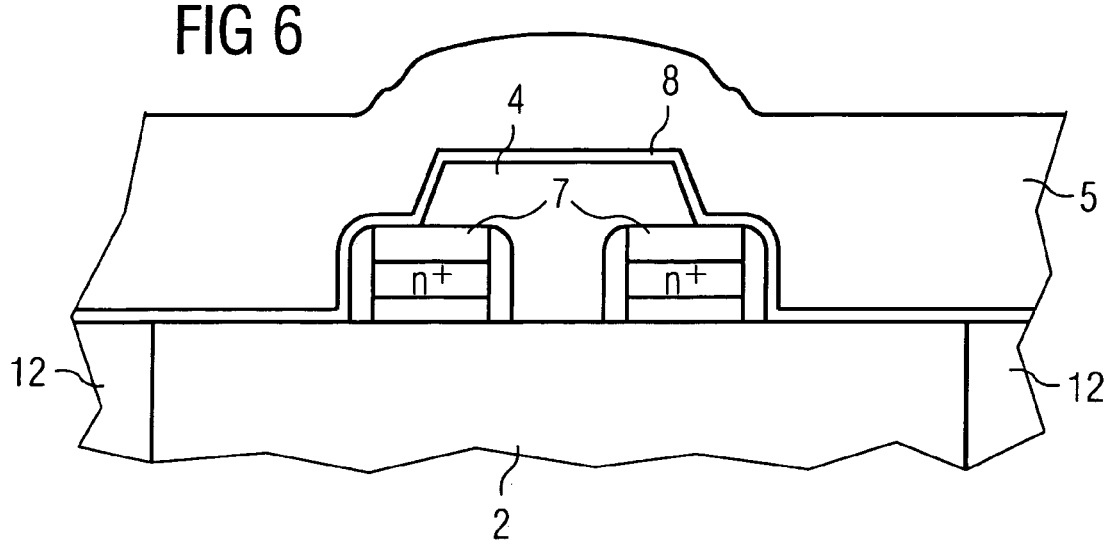
FIG. 6 shows the section from the previous figure after the PSG layer has been applied and subjected to a flow process.

In the next method step, the entire structure which has been produced thus far is covered with a first insulator layer 5. This may, for example, consist of phosphorus-doped silicate glass or of boron- and phosphorus-doped silicate glass. A silicate glass layer of this type is then subjected to a thermal flow process, which compensates for the level differences caused by the structure. FIG. 6 shows a polysilicon contact 4 which has been covered with a borosilicate glass layer which has been subjected to a flow process, as first insulator layer 5.

Figure 7:
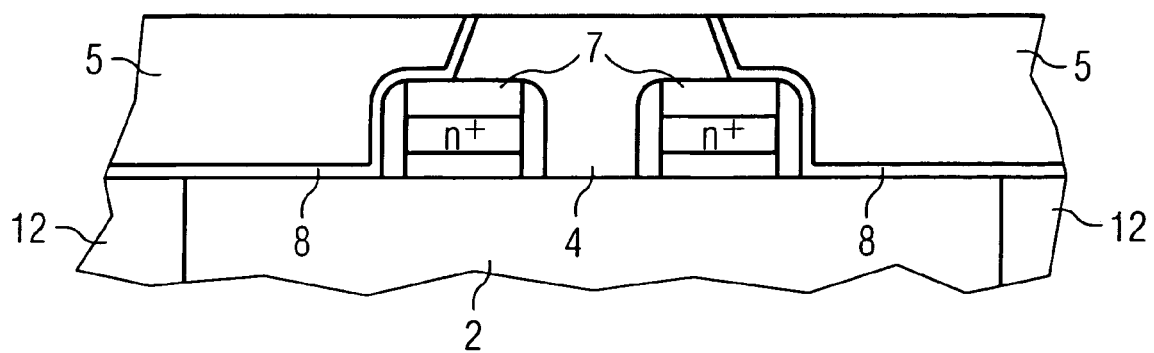
FIG. 7 shows the section from the previous figure after a planarization step has been carried out by chemical mechanical polishing.
Figure 8:
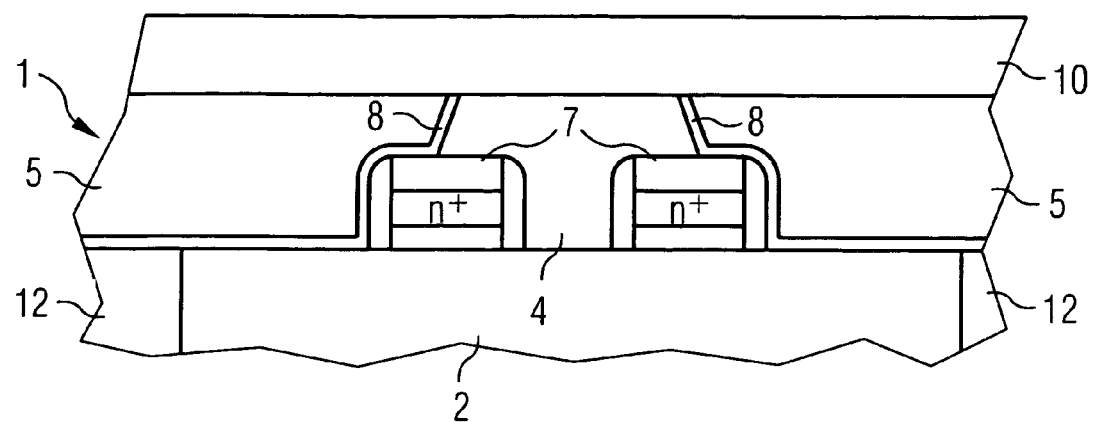
FIG. 8 shows the section from the previous figure after an $SiO_2$ layer has been applied.

Residual differences in level are substantially compensated for by a subsequent planarization step which removes material and uncovers the outer surface of the polysilicon contact 4. In the process, the first liner layer 8 which covers the outer surface of the polysilicon contact 4 is also removed. The result is the structure which can be seen in FIG. 7.

Next, the entire surface of the semiconductor wafer 1 is covered homogeneously with a second insulator layer 10. This is provided for the purpose of embedding the first metallization level M-0 and may consist, for example, of $SiO_2$ which has been applied using the TEOS process. The path of the metallic interconnects 24 of the first metallization level M-0 is then patterned into this second insulator layer 10, once again by means of known photolithographic patterning processes. In the process, at the locations of the subsequent interconnects 24, the second insulator layer 10 is removed until the outer surface of the polysilicon contact 4 is reached. The material is preferably removed down to a slightly greater depth, in order to ensure that the insulator layer is removed without any residues being left on the outer surface of the polysilicon contact 4.

The patterned removal of the second insulator layer 10 and the uncovering of the outer surface of the polysilicon contact 4, however, generally causes the outer surface of the polysilicon contact 4 to be oxidized in a layer which is close to the surface. In addition to the standard phenomena at metal-semiconductor transitions, this insulating $SiO_2$ layer prevents direct contact from being made between the polysilicon contact 4 and a metallic interconnect 24 of the first metallization level M-0 above it.

Figure 9:
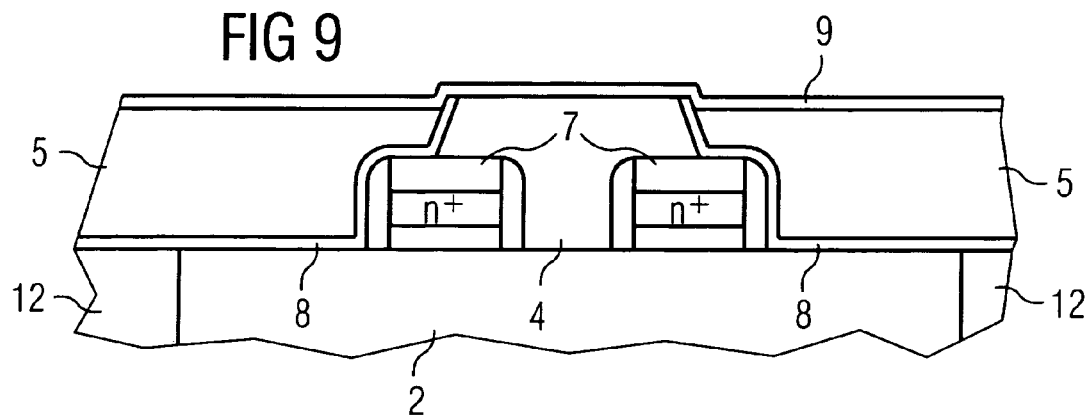
FIG. 9 shows the section from the previous figure after the patterned removal of the $SiO_2$ layer in order to produce the 0-th metallization level M0 with applied Ti liner layer.

It has proven advantageous to use the self-aligned contact method to produce the contacts between the outer surface of the polysilicon contact 4 and the metallic interconnect 24 which lies directly above it. For this purpose, a thin second liner layer 9, which may consist, for example, of titanium, is applied to the patterned second insulator layer 10. However, all metals which reduce the native $SiO_2$ layer located at the surface of the polysilicon contact 4 to form a highly conductive silicide are suitable for this purpose. The metals titanium, cobalt and nickel have proven particularly suitable for the silicide formation. FIG. 9 shows the structure which is produced after the application of the second liner layer 9. In this case, the channel which has been uncovered in the previous etching step for the interconnect 24 of the first metallization level M-0, which is to-be connected to the polysilicon contact 4, runs in the plane of the paper. Therefore, in FIG. 9 the surface of the semiconductor wafer 1 appears to be free of the second insulator layer 10, whereas in actual fact, parts of the surface of the semiconductor wafer 1 are still covered by the second insulator layer 10.

Figure 10:
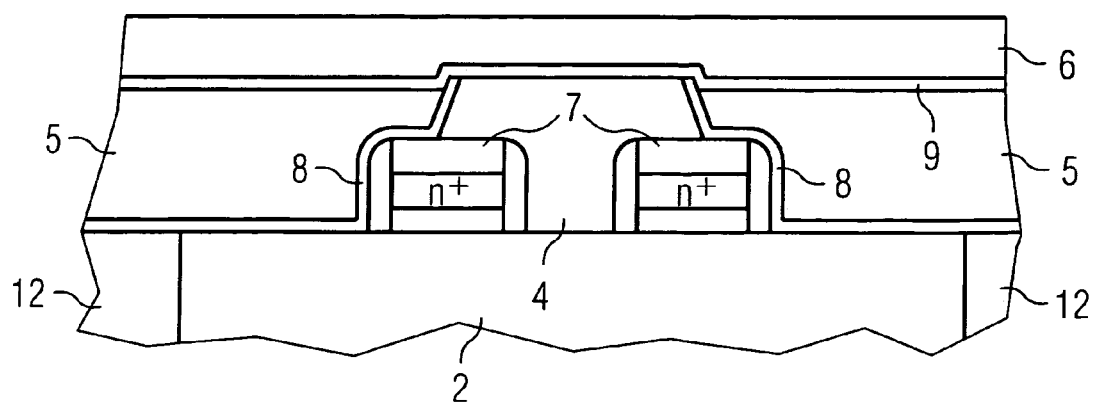
FIG. 10 shows the section from the previous figure after the tungsten-M0 level has been applied and planarized.

In the final method step, which can be seen from FIG. 10, the trenches which have been produced in the second insulator layer 10 are filled up with a metal as a result of the entire surface of the semiconductor wafer 1 being covered homogeneously with a metal layer 6. Tungsten may advantageously be used for this purpose. This step concludes the method according to the invention for fabricating a contact for an integrated circuit.

The building up of further layers on the semiconductor wafer 1, the patterning of these layers, etc. can now be carried out in accordance with the methods which are known from the prior art. In particular, the filling of the trenches which have been produced in the second insulator layer 10 with a metal will generally be followed by a planarization step, in order to produce a planar surface for the application of further layers to the semiconductor wafer 1.

Figure 11:
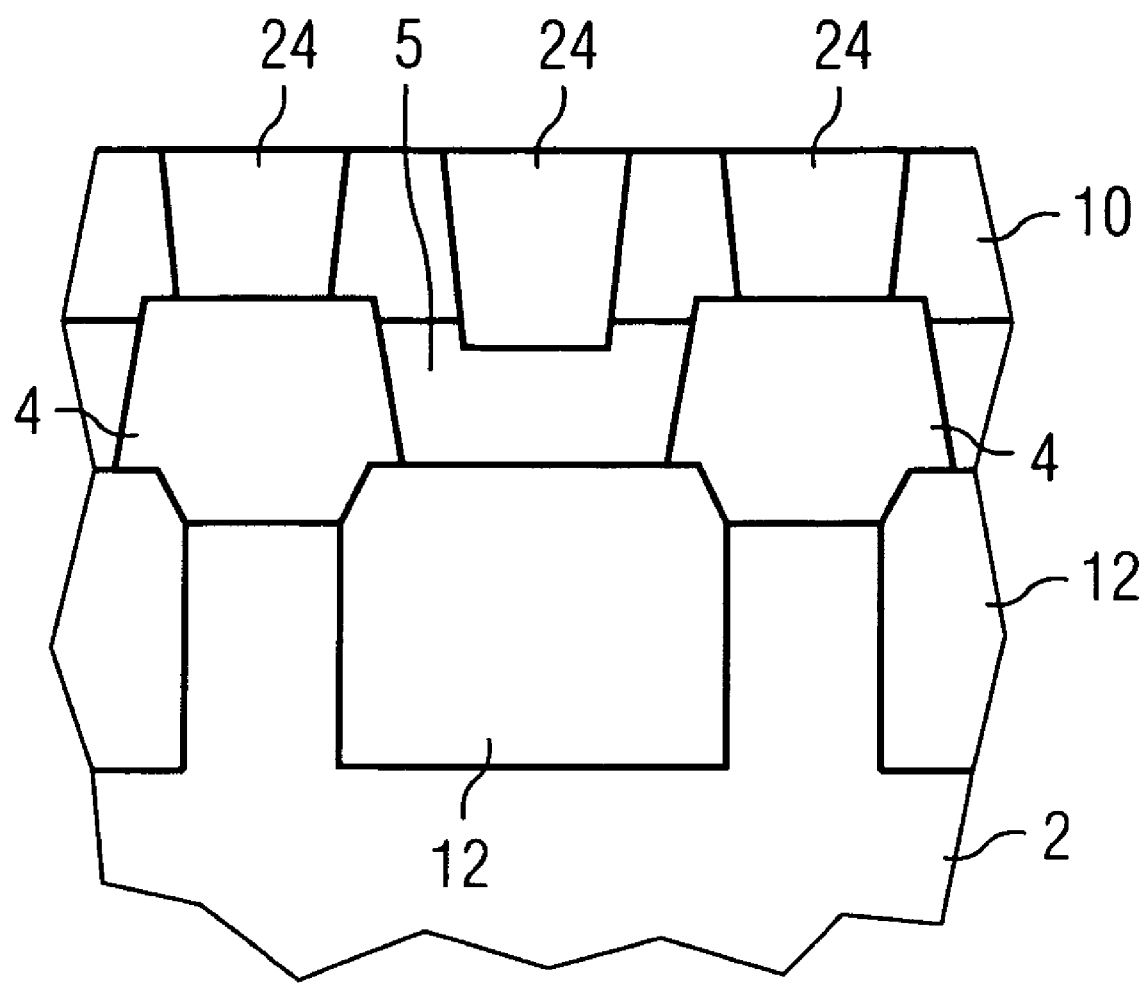
FIG. 11 shows a section through the structure shown in FIG. 10 but in section transversely with respect to the interconnects of the M0 level.

FIG. 11 diagrammatically depicts an excerpt from a DRAM. The figure shows a section through the semiconductor wafer 1 on which the DRAM has been built up and at the surface of which a plurality of active areas 2 are arranged. These active areas 2 are separated from one another by passive areas 12, in order to suppress crosstalk between the individual active areas 2. The passive areas 12 may be designed, for example, as "shallow trench insulators". There are polysilicon contacts 4 on each of the active areas 2. Gate lines 7, which are not shown in FIG. 11 for reasons of clarity, may be integrated in the polysilicon contacts 4. In principle, the structure of each individual polysilicon contact 4 may correspond to that of the polysilicon contact with enclosed gate lines 7 which can be seen from FIG. 10.

The polysilicon contacts 4 are embedded in the first insulator layer 5. As in the previous exemplary embodiment, this layer may consist of phosphorus-doped silicate glass (PSG). At their outer surface, the polysilicon contacts 4 are directly connected to metallic interconnects 24 belonging to the metallization level M-0 in a second insulator layer 10. As in the previous exemplary embodiment, the second insulator layer 10 may consist of $SiO_2$ which has been deposited using the TEOS process. In this case too, tungsten may be used as metal for the metal layer 10.

In a similar manner to the polysilicon contact 4 conductively connected to the metal layer 24 as shown in FIG. 10, in the structure which can be seen in FIG. 11, the first liner layer 8 and the second liner layer 9 are also present. However, these are not shown in FIG. 11 for the sake of clarity. FIG. 11 provides a purely diagrammatic illustration of the arrangement of a semiconductor structure which comprises a plurality of active areas 2 which, in a similar manner to the first exemplary embodiment, are connected to the first metallization level M-0, in particular to a metallic bit line of this first metallization level, by means of polysilicon contacts 4 according to the invention.

Figure 12:
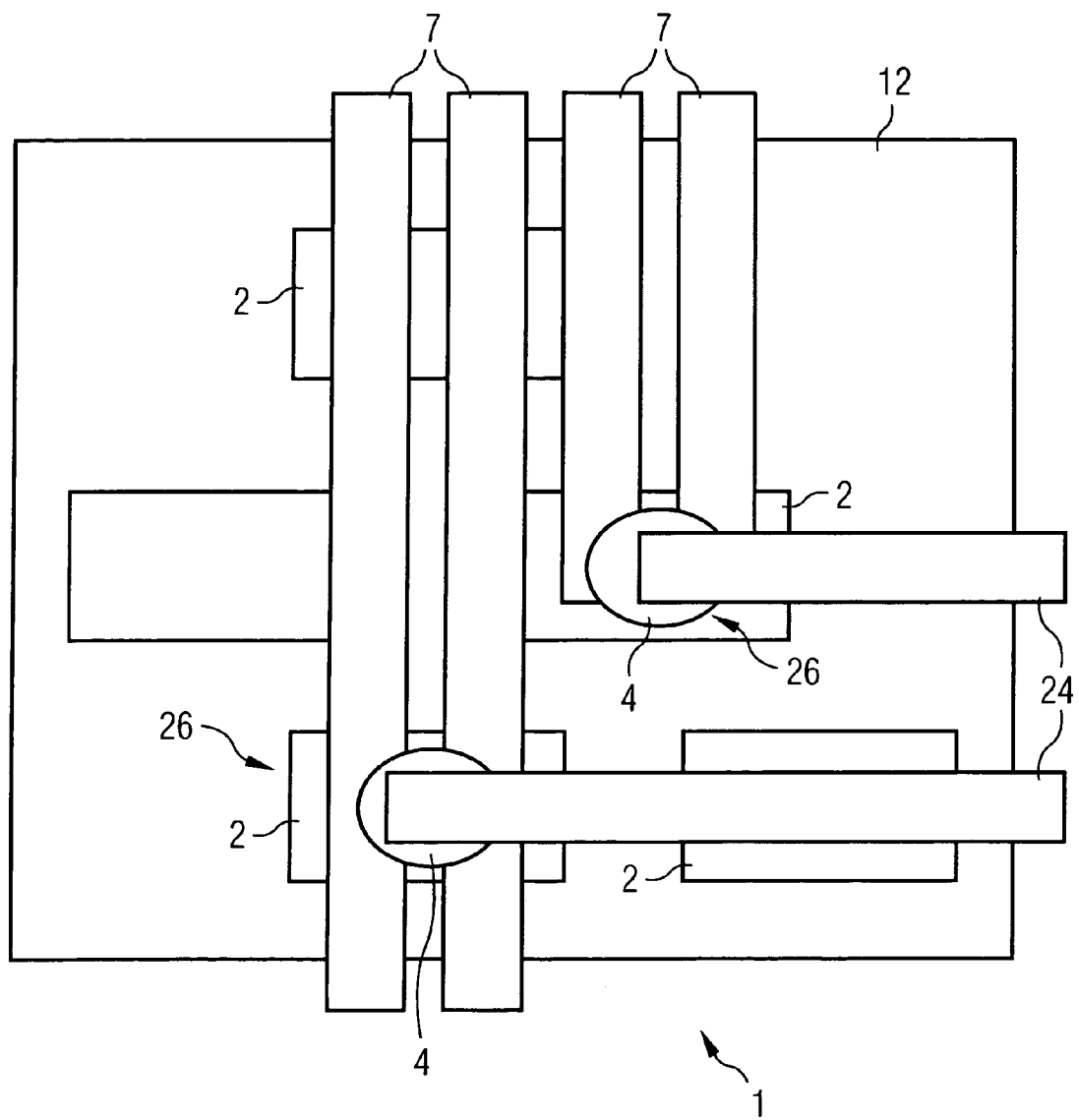
FIG. 12 shows a plan view of a structure which has been built up in a similar manner to that shown in FIG. 10.

FIG. 12 clearly shows the structure of the first metallization level M-0, which comprises metallic interconnects 24 which are embedded in the second insulator layer 10.

Finally, FIG. 12 diagrammatically depicts a plan view of a DRAM semiconductor structure, the structure of which substantially corresponds to the structure which can be seen from FIG. 11. It comprises a semiconductor wafer 1, in which a plurality of active areas 2 are integrated. A plurality of gate lines 7, which are provided for the purpose of driving select transistors 16 arranged in the active areas 2, run on the surface of the semiconductor wafer 1. FIG. 12 diagrammatically depicts the way in which contact is made between two memory arrays 25, the structure of which corresponds to that shown in FIG. 1. Each memory array 25 includes two memory cells 26 which can be driven individually. The select transistor 16 of each memory cell 26 of a memory array 25 is driven via a separate gate line 7. The common source electrode of the memory array 25, which comprises two memory cells 26, is connected to the associated metallic bit line 24 by means of a polysilicon contact 4, the polysilicon contact 4 being fabricated using the method according to the invention. The structure of the polysilicon contacts 4 which are illustrated as ellipses in FIG. 12 corresponds to that shown in FIG. 10. All the further structures which are required for a functional dynamic memory cell, such as for example electrical interconnects which are connected to the inner capacitor electrodes 21 of the trench capacitors 15 in order to read out the capacitor content, are not material to the method according to the invention and are therefore not shown in FIG. 12.

What is claimed is:

1. A semiconductor component of a semiconductor circuit, comprising:
   an active area comprising circuit elements and embedded in a semiconductor wafer;
   a pair of isolated control lines formed on the semiconductor wafer;
   at least one electrical contact embedded in a first insulator layer and disposed above the active area and between the pair of isolated control lines, the electrical contact being electrically and physically connected with the active area; and
   a second insulator layer disposed over the electrical contact and having a conductive line formed therein, the conductive line being electrically connected with an upper surface of the electrical contact, wherein the conductive line crosses the electrical contact and has a recess formed therein, and wherein at least a portion of the electrical contact, that forms the upper surface, projects into the recess of the conductive line, wherein the recess is electrically and physically connected with the upper surface of the electrical contact and wherein a thickness of the conductive line is smaller at the recess than beyond the recess.

2. The semiconductor component of claim 1, wherein the electrical contact is a polysilicon contact.

3. The semiconductor component of claim 1, wherein the semiconductor circuit is a part of a dynamic random access memory (DRAM).

4. The semiconductor component of claim 1, wherein the semiconductor circuit comprises a memory cell.

5. The semiconductor component of claim 1, wherein the conductive line is a bit line.

6. The semiconductor component of claim 1, wherein the isolated control lines are gate lines.

7. The semiconductor component of claim 1, wherein the circuit elements comprise a pair of select transistors each being electrically connected to a respective one of the isolated control lines.

8. The semiconductor component of claim 1, wherein the circuit elements define a pair of memory cells each being electrically connected to a respective one of the isolated control lines, and wherein the electrical contact is electrically connected to the memory cells at a common electrode.

9. The semiconductor component of claim 8, wherein the electrical contact is a polysilicon contact.

10. The semiconductor component of claim 8, wherein the isolated control lines are gate lines and the conductive line is a bit line.

11. The semiconductor component of claim 1, wherein the conductive line includes a liner layer and a metal layer which lies above the liner layer.

12. The semiconductor component of claim 11, wherein the liner layer is formed of a conductive silicide.

13. The semiconductor component of claim 11, wherein the liner layer includes a metal which reduces $SiO_2$ to form the conductive silicide.

14. The semiconductor component of claim 13, wherein the metal is one of the group of titanium, cobalt and nickel.

15. The semiconductor component of claim 1, wherein the conductive line and the isolated control lines are generally orthogonal to one another.

16. A semiconductor component of a semiconductor circuit, comprising:
    an active area comprising circuit elements and embedded in a semiconductor wafer;
    a pair of isolated control lines formed on the semiconductor wafer; wherein the isolated control lines are gate lines;
    at least one electrical contact embedded in a first insulator layer and disposed above the active area and between the pair of isolated control lines, the electrical contact being electrically and physically connected with the pair of isolated control lines; and
    a second insulator layer disposed over the electrical contact and having a bit line formed therein, the bit line being electrically connected with an upper surface of the electrical contact, wherein the bit line crosses the electrical contact and has a recess, and the electrical contact projects into the recess of the bit line, wherein the recess is electrically and physically connected with the upper surface of the electrical contact and a second surface of the bit line, and wherein the circuit elements define a pair of memory cells each being electrically connected to a respective one of the isolated control lines, and the electrical contact is electrically connected to the memory cells at a common electrode; and
    wherein at least the portion of the electrical contact that forms the upper surface is disposed between the isolated control lines and an upper surface of the bit line, and has a tapered cross section; and wherein a surface of the bit line has a smaller cross section than an adjacent cross section of the electrical contact.

17. The semiconductor component of claim 16, wherein the bit line includes a liner layer and a metal layer which lies above the liner layer, and wherein the liner layer includes a metal which reduces $SiO_2$ to form a conductive silicide.

18. The semiconductor component of claim 16, wherein the bit line and the isolated control lines are generally orthogonal to one another.

* * * * *